United States Patent
Bou Daher et al.

(10) Patent No.: US 12,096,189 B2
(45) Date of Patent: Sep. 17, 2024

(54) DYNAMIC HEADROOM MANAGEMENT

(71) Applicant: Bose Corporation, Framingham, MA (US)

(72) Inventors: Elie Bou Daher, Marlborough, MA (US); Cristian Marius Hera, Lancaster, MA (US)

(73) Assignee: Bose Corporation, Framingham, MA (US)

( * ) Notice: Subject to any disclaimer, the term of this patent is extended or adjusted under 35 U.S.C. 154(b) by 33 days.

(21) Appl. No.: 17/600,210

(22) PCT Filed: Mar. 27, 2020

(86) PCT No.: PCT/US2020/025362
§ 371 (c)(1),
(2) Date: Sep. 30, 2021

(87) PCT Pub. No.: WO2020/205571
PCT Pub. Date: Oct. 8, 2020

(65) Prior Publication Data
US 2022/0210554 A1     Jun. 30, 2022

Related U.S. Application Data

(60) Provisional application No. 62/827,529, filed on Apr. 1, 2019.

(51) Int. Cl.
*H04R 3/00*       (2006.01)
*G10K 11/178*       (2006.01)

(52) U.S. Cl.
CPC ....... *H04R 3/007* (2013.01); *G10K 11/17854* (2018.01); *H04R 2430/01* (2013.01)

(58) Field of Classification Search
CPC ............... H04R 3/007; H04R 2430/01; G10K 11/17854
See application file for complete search history.

(56) References Cited

U.S. PATENT DOCUMENTS

| | | | |
|---|---|---|---|
| 2012/0201400 A1* | 8/2012 | Ayres ..................... | H03G 7/004 381/107 |
| 2012/0207317 A1* | 8/2012 | Abdollahzadeh Milani ............... | G10K 11/17817 381/71.6 |

(Continued)

FOREIGN PATENT DOCUMENTS

| JP | 2014521988 A | 8/2014 |
|---|---|---|
| WO | 2008014214 A2 | 1/2008 |

OTHER PUBLICATIONS

International Search Report and Written Opinion dated Jun. 17, 2020 for PCT/US20/25362.

(Continued)

*Primary Examiner* — Daniel R Sellers

(57) ABSTRACT

Audio systems, methods, and computer readable media for managing audio headroom are provided. At least two input signals are received and combined. The combined signals is compared to a threshold value and may be adjusted if the combined signal exceeds the threshold value. A gain is applied to the first input signal based upon the combined signal being above the threshold value. The gain may be an attenuating gain. Accordingly, a gain is applied to at least one input signal to reduce the input signal when a combination of the input signals exceeds a threshold value.

17 Claims, 5 Drawing Sheets

(56) References Cited

U.S. PATENT DOCUMENTS

| | | | |
|---|---|---|---|
| 2013/0287219 A1* | 10/2013 | Hendrix | G10K 11/175 381/71.6 |
| 2014/0219478 A1 | 8/2014 | Takahashi et al. | |
| 2015/0200643 A1* | 7/2015 | Skoglund | H03G 7/002 381/98 |
| 2015/0350783 A1* | 12/2015 | Krishnaswamy | H04R 3/007 381/55 |
| 2018/0184219 A1* | 6/2018 | Van Der Werf | H04R 25/505 |

OTHER PUBLICATIONS

JP Office Action dated Dec. 5, 2022 for JP application 2021-558807.

* cited by examiner

DYNAMIC HEADROOM MANAGEMENT

CROSS REFERENCE TO RELATED APPLICATIONS

This application claims the benefit of U.S. Provisional Patent Application Ser. No. 62/827,529, titled DYNAMIC HEADROOM MANAGEMENT, filed Apr. 1, 2019, and incorporated herein in its entirety for all purposes.

BACKGROUND

Audio systems, such as vehicle and automobile audio systems, may share various output transducers (e.g., loudspeakers) among multiple subsystems that implement varying features. For example, an audio system may play entertainment audio (such as occupant-selected audio like radio stations, streaming music, etc.), navigation prompts, warning audio (such as blind-spot or lane drift warnings), incoming telephone calls, and the like. Some example vehicle systems may also generate cancelation signals intended to reduce undesired acoustic energy, such as road noise and/or engine noise, and/or may generate enhancement sounds such as engine harmonic enhancement or other sound effects. Accommodating all such audio demands through common output transducers (e.g., loudspeakers) may overload one or more loudspeakers, which may accommodate only a limited signal voltage or total power, for instance. Accordingly, there is a need to balance the available power limit (e.g., headroom) among multiple audio signals.

SUMMARY

Aspects and examples are directed to systems and methods that provide dynamic headroom management for balancing the needs of multiple audio signals or functions through one or more common output transducers, hereafter referred to as loudspeakers (but may take any of varying forms). Examples disclosed herein detect when headroom is being exhausted and may prioritize one audio signal over another by, e.g., attenuating (decreasing the amplitude) of a lower priority signal. Various examples may provide adjustment of multiple signals to balance the available headroom among any number of signals. For example, when entertainment audio demand is high (e.g., volume turned up), an anti-noise signal provided by an RNC system may be reduced (attenuated) to avoid overdriving a loudspeaker.

According to one aspect, a method of managing audio headroom is provided that includes receiving a first input signal, receiving a second input signal, combining the first and second input signals to provide a combined signal, comparing the combined signal to a threshold value, providing the combined signal as an output signal if the combined signal is less than the threshold value, providing an adjusted signal as the output signal if the combined signal is greater than the threshold value, the adjusted signal based on the combined signal, and adjusting a gain applied to the first input signal based upon the combined signal being above the threshold value.

Some examples include counting a number of instances that the combined signal is above the threshold value and adjusting the gain applied based upon the number of instances.

Various examples include determining a rate of instances that the combined signal is above the threshold value and adjusting the gain applied based upon the rate of instances.

Various examples include providing an attenuation flag when the gain applied is below a gain threshold. Some examples also include receiving the attenuation flag and freezing adaptation of an adaptive filter in response to receiving the attenuation flag. In certain examples, the first input signal may be an anti-noise signal provided by a noise cancelation system and the adaptive filter may be a component of the noise cancelation system.

Certain examples include providing a limiting flag when the combined signal is greater than the threshold value.

According to another aspect, a dynamic headroom management system is provided that includes two or more inputs to receive input signals, a combiner coupled to the two or more inputs that receives the input signals, combines the input signals, and provides a combined signal, a limiter coupled to the combiner that receives the combined signal, compares the combined signal to a threshold, provides an indicator when the combined signal exceeds the threshold, and provides an output signal based upon the combined signal, and a controller coupled to the limiter that receives the indicator and applies a gain to at least one of the input signals based upon the indicator.

According to some examples, the controller counts a number of instances that the combined signal is above the threshold value, based upon the indicator, and adjusts the gain applied based upon the number of instances.

In certain examples, the controller may determine a rate of instances that the combined signal is above the threshold value and adjusts the gain applied based upon the rate of instances.

In various examples, the controller may provide an attenuation flag when the gain applied is below a gain threshold. Further, an adaptive system may receive the attenuation flag and freeze adaptation of an adaptive filter in response to receiving the attenuation flag, in some examples. In certain examples, the adaptive system may be a noise cancelation system and the first input signal is an anti-noise signal provided by the noise cancelation system.

According to another aspect, a non-transitory processor readable storage medium is provided having instructions encoded thereon that when executed by a processor cause the processor to receive a first input signal, receive a second input signal, combine the first and second input signals to provide a combined signal, compare the combined signal to a threshold value, provide the combined signal as an output signal if the combined signal is less than the threshold value, provide an adjusted signal as the output signal if the combined signal is greater than the threshold value, the adjusted signal based on the combined signal, and adjust a gain applied to the first input signal based upon the combined signal being above the threshold value.

In some examples the processor may count a number of instances that the combined signal is above the threshold value and adjust the gain applied based upon the number of instances.

In certain examples the processor may determine a rate of instances that the combined signal is above the threshold value and adjust the gain applied based upon the rate of instances.

In various examples the processor provides an attenuation flag when the gain applied is below a gain threshold. According to some examples the processor may freeze adaptation of an adaptive filter in response to the attenuation flag. In certain examples, the first input signal may be an anti-noise signal provided by a noise cancelation system and the adaptive filter may be a component of the noise cancelation system.

In certain examples the processor may provide a limiting flag when the combined signal is greater than the threshold value.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the inventions. In the figures, identical or nearly identical components illustrated in various figures may be represented by a like reference character or numeral. For purposes of clarity, not every component may be labeled in every figure. In the figures.

DETAILED DESCRIPTION

Figure 1:
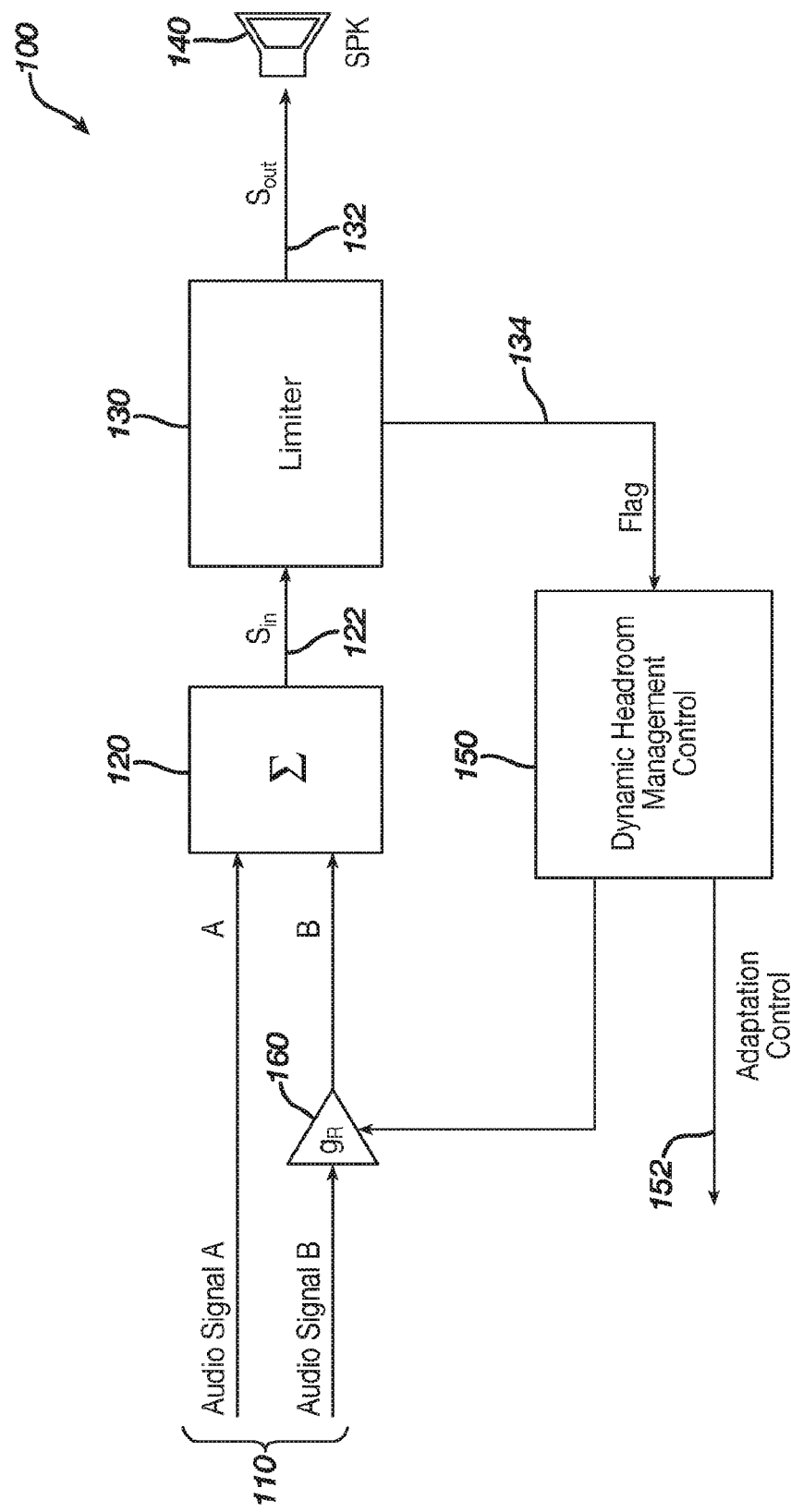
FIG. 1 is a schematic diagram of an example headroom management system.

Aspects of the present disclosure are directed to audio systems and methods that provide signals to one or more loudspeakers to transduce a plurality of audio signals into acoustic energy in an environment such as an occupant compartment of a vehicle. The audio systems and methods herein limit a combination of the audio signals to an available power-handling capability of the loudspeakers while dynamically adjusting the audio signals to control a distribution of power allocated to the individual audio signals. Various examples include a limiter that may adjust an output signal, in some cases on a sample-by-sample basis, to prevent a total output voltage from exceeding a voltage limit of a loudspeaker. The limiter may indicate, e.g., via an output flag, each time the output signal is adjusted (or "limited"). Various examples include a controller that monitors the output flag to determine how often the output signal is limited, over a period of time—or a rate at which the output signal is limited, or a duty cycle or fraction of time at which the output signal is limited—to determine whether one of more of the audio signals should be adjusted. The controller may select one or more of the audio signals to be adjusted, and by how much, and may control a gain component to adjust the selected audio signals.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

A block diagram of an example dynamic headroom management system or algorithm for one speaker is illustrated in FIG. 1 and described in more detail below. A combiner sums a first input audio signal A with a second input audio signal B to produce a combined signal $S_{in}$, which is an input to a limiter block. The limiter limits the combined signal below a predetermined threshold to provide a limited output signal $S_{out}$ to the speaker. The limiter may send a limiter flag to a dynamic headroom management control block whenever the limiter limits (or adjusts) the combined signal. The dynamic headroom management control block may adjust one of the input audio signals (audio signal B in this example), illustrated in this example by a gain applied to the second audio signal B. Accordingly, the second audio signal B may be reduced (attenuated) such that the limiter block may cease having to apply a limit to the combined signal. In various examples, the dynamic headroom management control block may monitor or compute a limiter hit rate and may adjust, determine, or select the gain accordingly.

In various examples, the dynamic headroom management control block may provide a flag to indicate that it has applied an attenuation to the second input audio signal B. For example, the audio signal B may be an output of an adaptive system, such as an RNC system, and it may be desirable to pause or freeze adaptation so long as an attenuation is applied to the RNC system's output signal. Otherwise the RNC system may adapt to try and increase its share of the headroom, e.g., by increasing the amplitude of the RNC output signal, in competition with the gain (attenuation) applied by the dynamic headroom management control block. Accordingly, in some examples, an exterior system (not shown) may receive the flag from the dynamic headroom management control block and may control adaptation (or other functionality) that influences the input audio signal to which the attenuation is applied.

As discussed above, FIG. 1 illustrates such an example system 100 and includes inputs 110 to receive the input audio signals, a combiner 120 that combines the audio signals, such as by adding the audio signals to provide a combined audio signal 122, a limiter 130 that receives the combined audio signal 122 and provides an output signal 132 to a loudspeaker 140. The limiter 130 also indicates when it is limiting the output signal 132 via a flag 134 (e.g., a limiter flag), which is provided to a controller 150. The controller 150 may adjust 160 one of the input audio signals, such as by applying a gain, which may be an attenuating gain, i.e., having a gain factor less than one. Finally, the controller 150 may also provide a flag 152 to indicate when the audio signal is being adjusted, such as by application of anything other than a unity gain. In some examples the audio signal may be attenuated and the flag 152 may be considered an attenuation flag. In certain examples the attenuation flag may indicate whenever the gain is below some gain threshold, such as below 1.0 or below 0.99.

In various examples, the limiter 130 may be a sample-by-sample limiter that operates on a digital signal on a sample-by-sample basis to ensure that voltages provided to the loudspeaker 140 do not exceed a certain limit.

Figure 2:
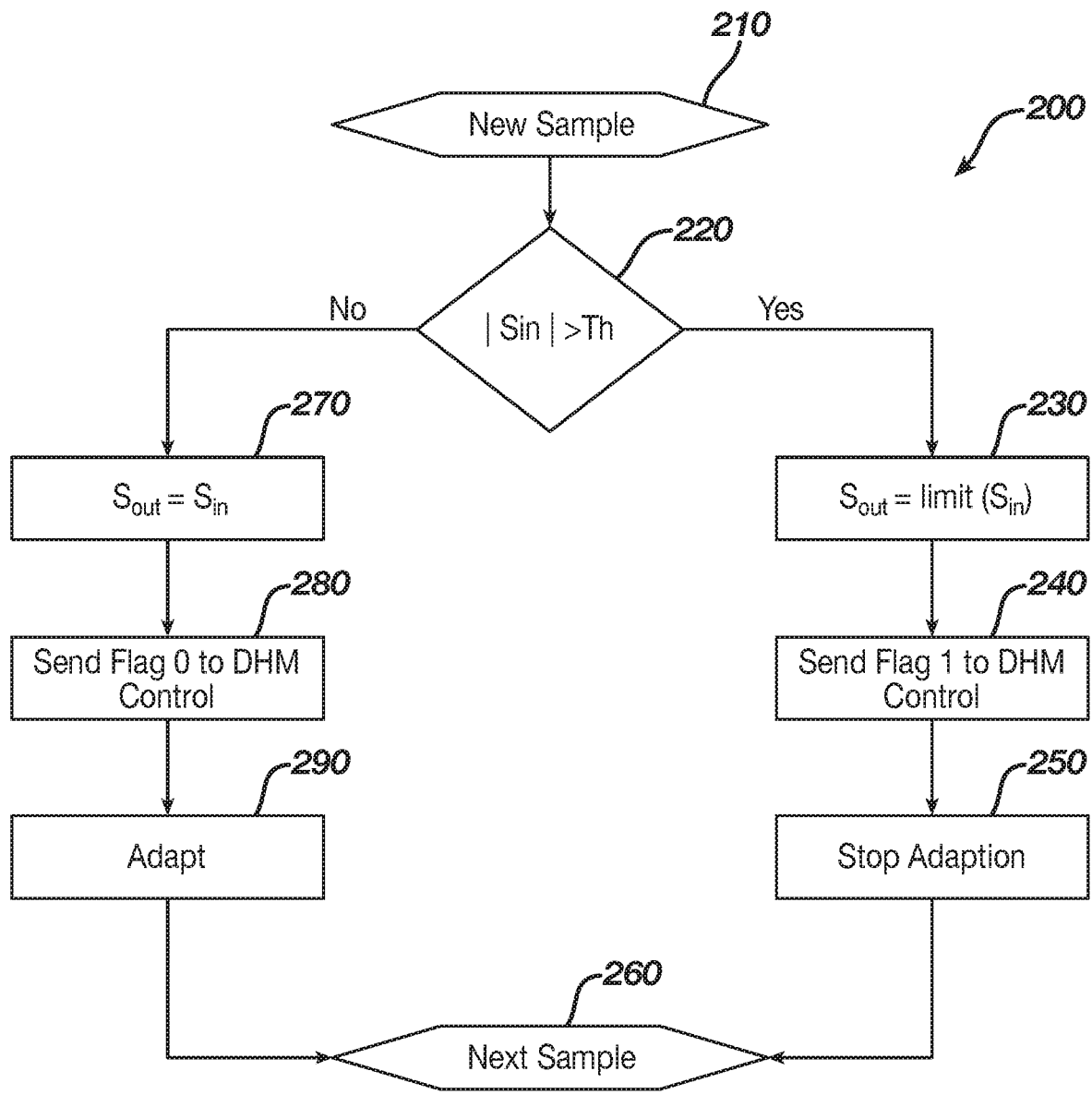
FIG. 2 is a flow diagram executable by an example limiter suitable for use in the system of FIG. 1.

FIG. 2 illustrates an example flow diagram 200 that may be executed by the example limiter 130. As above, the primary role of a limiter 130 is to prevent an output signal from exceeding a certain voltage, e.g., to protect a downstream electrical component, such as the loudspeaker 140. In general, the limiter 130 provides an output signal that matches an input signal unless the input signal exceeds a threshold, in which case the limiter adjusts the output signal to ensure that it does not exceed some upper limit. The example flow diagram 200 works on a sample-by-sample basis and limits the output signal below a predetermined upper limit. With continued reference to FIG. 2, a sample of the input signal, which may be a sample of the combined audio signal 122 (see FIG. 1), is received (block 210) and compared to a threshold (block 220). If the input sample exceeds the threshold, a value for an output sample is determined (block 230) by a limiting function, $S_{out}=\text{limit}(S_{in})$. The limiting function may be any function, many of which are well known in the art, but generally will provide an output sample value lower than the input sample value and only up to a certain maximum upper limit. In some examples, the limiting function may provide hard clipping by setting the output sample to the threshold value whenever the input sample is equal to or greater than the threshold value. In other examples, the limiting function may provide gradually tapered output samples based upon the input sample up to the upper limit, e.g., for an ever-increasing input signal the output signal may exponentially approach the upper limit. Details of any particular limiting function are not presented herein as many such examples exist in the prior art.

Continuing with reference to the example flow diagram 200 of FIG. 2, triggering of the limiting function of block 230 indicates that the combined audio signal 122 has run out of headroom, which may be interpreted as at least one of the audio signals at inputs 110 of the combined audio signal 122 consuming too much headroom for the audio system overall. Accordingly, a flag 134 (e.g., flag=1) is sent to the dynamic headroom management (DHM) control block, e.g., the controller 150 of FIG. 1, at block 240. Additionally, the limiting function of block 230 causes a non-linear relationship between the input and output signals of the limiter 130 and, accordingly, any adaptation being performed by external sources of the audio signals at inputs 110 should be halted (block 250), which may be achieved by sending a flag to the external system. For example, adaptive filters may operate with feedback microphones to determine linear relationships in various systems, such as road noise and/or engine harmonic cancelation systems, but the limiting function of block 230 represents non-linear processing that would otherwise cause such cancelation systems to improperly adapt. The example flow diagram 200 continues by proceeding to the next sample (block 260).

Returning to block 220, if the input sample does not exceed the threshold, the value for the output sample is set equal to the input sample (block 270), e.g., it is passed through the limiter 130 without alteration or adjustment. Alternately stated, no limiting function is triggered when the input sample does not exceed the threshold. Accordingly, no flag 134 is indicated (e.g., flag=0) to the DHM control (e.g., controller 150 of FIG. 1) (block 280), and adaptation of any adaptive system may continue (block 290).

In some examples, a limiter, such as the limiter 130 of FIG. 1, may act on the combined audio signal 122 thereby without knowledge of the individual audio signal inputs 110. In other examples, a limiter may be applied to one of the audio signal inputs 110, effectively forcing the limited input audio signal to be lower priority, e.g., with lower upper limit, prior to being combined with one or more of the other audio signal inputs 110. In such examples, a further limiter, which may be applied external to the system 100, may be included to ensure that a final output signal does not exceed a limit.

In various examples, the controller 150, also referred to herein as the dynamic headroom management control block, may receive the limiter flag 134 at every sample, and may compute a limiter hit rate (or simply "hit rate") over a predefined duration to determine whether an adjustment should be made to one or more of the audio signal inputs 110. For example, if the limiter flag 134 only occasionally indicates that the limiter 130 made an adjustment to the output signal 132, a high value of the combined audio signal 122 may only be temporary, or may be only a few samples, and there may be no need to adjust any of the audio signals at inputs 110. However, if the limiter flag 134 indicates a series of adjustments to the output signal 132 over time, the high value of the combined audio signal 122 may justify adjusting down (attenuating) one or more of the audio signals at inputs 110. In various examples, a selected one or more of the audio signals at inputs 110 may be adjusted down by applying a gain 160, which may be based upon the computed limiter hit rate. In general, the adjustment due to a high limiter hit rate is an attenuation, meaning a value of the gain 160 of less than unity.

In various examples, the limiter hit rate is computed over a predefined duration. In order to ensure a fast update of the hit rate while maintaining a low memory requirement, the hit rate duration may be partitioned into $N_{sub}$ subblocks and the number of limiter hits, e.g., instances of the flag 134 being set (e.g., flag=1), is computed for each subblock as shown in the following figure.

| $N_0$ | $N_1$ | $N_2$ | ... | $N_{sub-1}$ |
|---|---|---|---|---|

In some examples, two counters may be used to compute the number of hits in the last subblock. The first one goes from 1 to Hit Rate Duration/$N_{sub}$ and the second one counts the number of hits over the subblock duration. The number of hits is then used to update the buffer and the two counters are reset.

The limiter hit rate may then be computed as:

$$\text{Hit Rate} = \frac{N_{hits}(n_{DHM})}{\text{Hit Rate Duration}} = \frac{\sum_{i=0}^{sub-1} N_i}{\text{Hit Rate Duration}},$$

where $N_{hits}(n_{DHM})$ is the total number of limiter hits at the current update.

An efficient implementation of the limiter hit rate computation may include a circular buffer to store the number of hits per subblock and two additions to compute the total number of hits over the duration, such as:

$$N_{hits}(n_{DHM}) = N_{hits}(n_{DHM}-1) - N_0 + N_{current},$$

where $N_{hits}(n_{DHM}-1)$ is the total number of hits at the previous update, $N_0$ is the first inserted value in the buffer, and $N_{current}$ is the last computed value which will replace $N_0$ in the buffer.

In various examples, the adjustment gain 160 may be determined by the controller 150 based upon the limiter hit rate. In accord with the above, the limiter hit rate is a fractional value, bounded between 0 and 1. In some examples, this range may be partitioned into three regions. A first region between 0 and $r_1$ (a low hit rate), a second region between $r_1$ and $r_2$ (a mid-range hit rate), and a third region between $r_2$ and 1 (a high hit rate). When the limiter hit rate is low, e.g., within the first region, the controller 150 may increase the adjustment gain 160 up until it reaches unity. When the limiter hit rate is mid-range or high, e.g., when it lies in the second or third region, the controller 150 may reduce the adjustment gain 160 down, potentially until it reaches 0. Accordingly, the controller 150 over time may try to return the adjustment gain 160 to unity whenever the limiter hit rate is low and may reduce the adjustment gain 160 (e.g., increase attenuation) of a selected one (or more) of the audio signals at inputs 110 whenever the limiter hit rate is mid-range or high.

In some examples, the controller 150 may reduce the adjustment gain 160 down more quickly when the limiter hit rate is in the high region than when in the mid-range region. In some examples, the controller 150 may determine a rate of adjustment of the adjustment gain 160 based upon the value of the limiter hit rate, as described in greater detail below.

In certain examples, the adjustment gain 160 may be updated in accord with the following equation:

$$g_R(n) = \begin{cases} g_R(n-1) + StepU_{max} \cdot [(1 - \text{Hit Rate})/r_1], & 0 < \text{Hit Rate} \le r_1 \\ g_R(n-1) \cdot StepD_{max} \cdot [(1 - \alpha_{attack} \cdot L_{adjust})], & r_1 < \text{Hit Rate} \le 1 \end{cases}$$

$StepU_{max}$ and $StepD_{max}$ denote the maximum step up and maximum step down in the gain update, respectively. The parameter $\alpha_{attack}$ is chosen to control how quickly the adjustment gain 160 is reduced. The level adjustment $L_{adjust}$ may be used to control the rate of adjustment based upon the value of the hit rate, e.g., a higher hit rate causing the rate of adjustment to be more drastic or rapid. In various examples, other functions may be used to compute the adjustment gain 160. In some examples, the level adjustment $L_{adjust}$ may be linearly increasing in the second region and may maintain a maximum value of unity in the third region, as follows:

$$L_{adjust} = \begin{cases} \frac{\text{Hit Rate} - r_1}{r_2 - r_1}, & r_1 < \text{Hit Rate} \le r_2 \\ 1, & r_2 < \text{Hit Rate} < 1 \end{cases}$$

In various examples, other functions may be used to compute $L_{adjust}$.

Additionally, the controller 150 may provide the flag 152 as an indicator to other systems, such as the source(s) of one or more of the audio signals at inputs 110, whenever the controller 150 applies an adjustment gain 160 other than unity, or in some instances, whenever the adjustment gain 160 is some threshold level below unity. For example, the flag 152 may be used by another system, such as an adaptive noise cancelation system, e.g., to freeze adaptation for a duration while its anti-noise signal is being attenuated, e.g., an adjustment gain 160 below unity is being applied.

Figure 3:
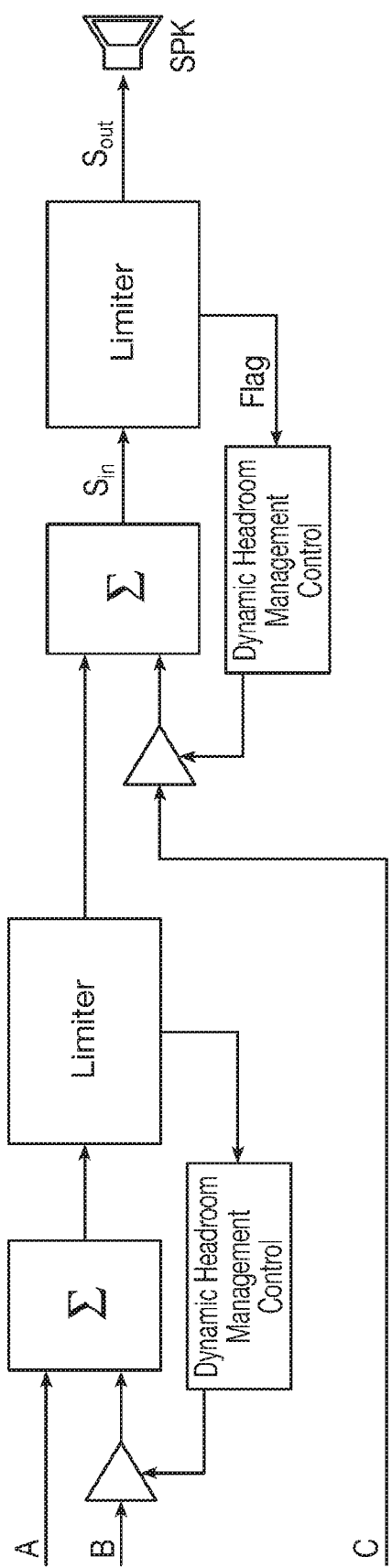
FIG. 3 is a schematic diagram of another example headroom management system.
Figure 4:
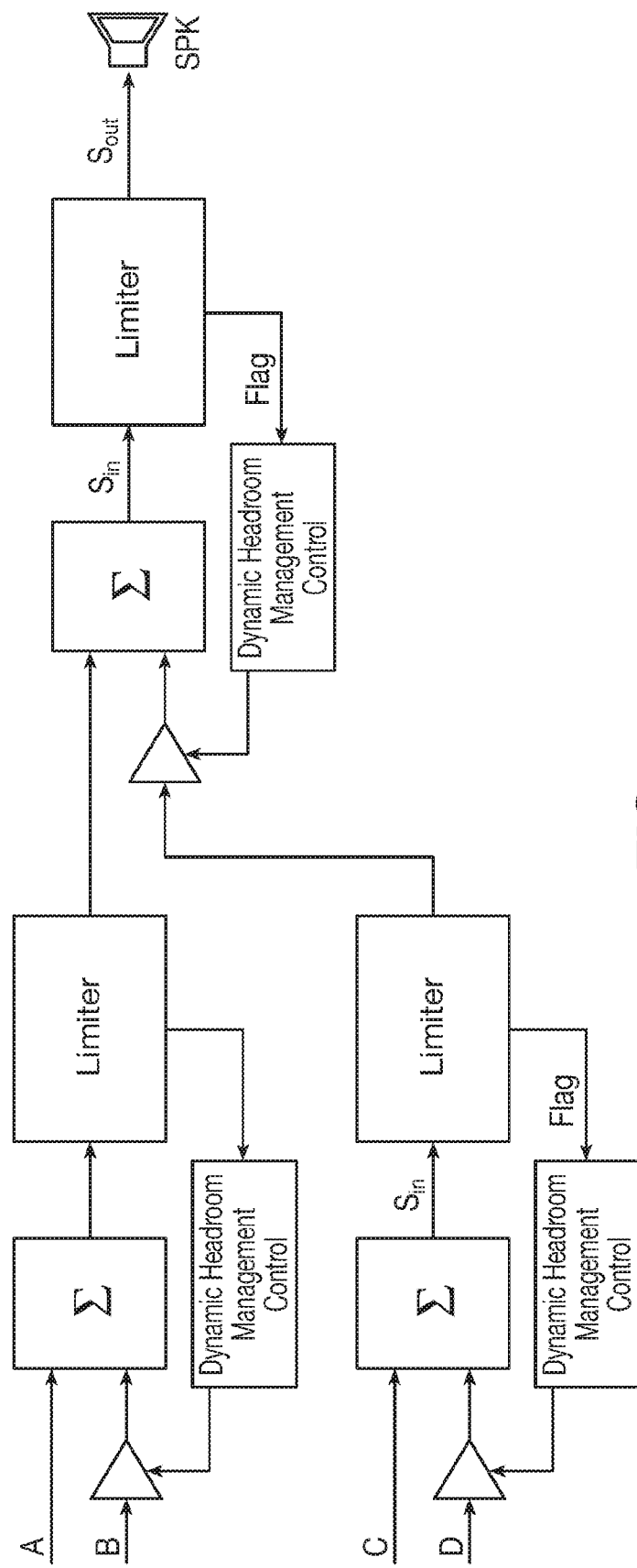
FIG. 4 is a schematic diagram of another example headroom management system.

The above described systems and methods were described for two signals, such as entertainment audio and road noise cancelation. However, they may be modified and extended to cover a multitude of signals such as entertainment audio, phone, announcements, road noise cancelation, engine harmonic enhancement, and engine harmonic cancelation. In various examples, additional input audio signals may be accommodated by cascading a plurality of the example system 100 (e.g., FIG. 1), such as illustrated in FIG. 3 (which may be extended to any number of 'serial' systems having a limiter and gain control), or by stacking a plurality of the example system 100, e.g., in 'parallel,' such as illustrated in one example in FIG. 4, which may include additional system 100 to combine the various outputs.

Figure 5:
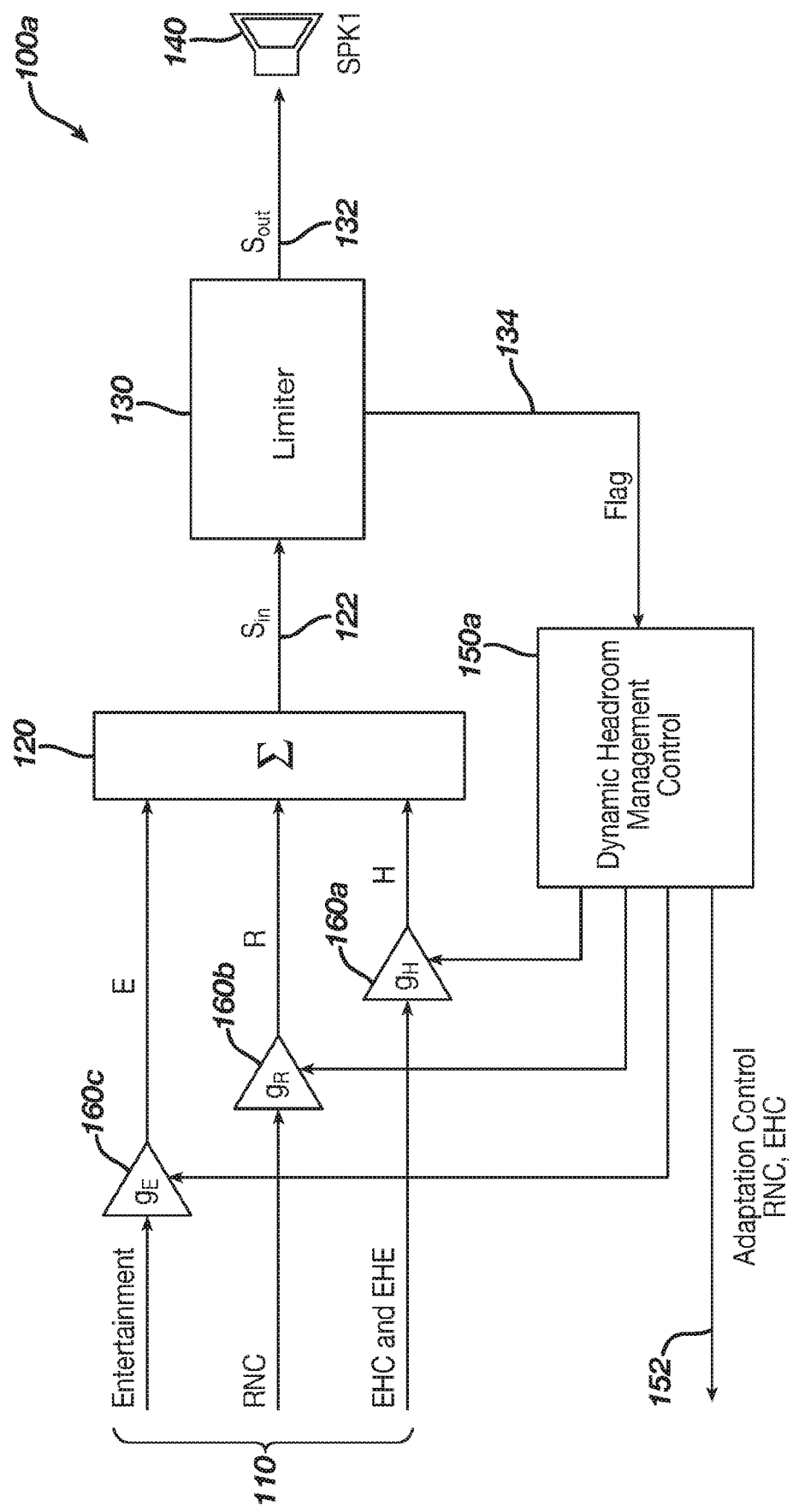
FIG. 5 is a schematic diagram of another example headroom management system.

Additionally, various examples may implement a more integrated system, such as the example multi-input system 100a illustrated in FIG. 5. The example system 100a is similar to the example system 100 in FIG. 1, having a number of audio signal inputs 110. The examples system 100a includes a controller 150a capable of applying respective adjustment gains 160a, 160b, 160c, to individual ones of the audio signal inputs 110. Similar to the above descriptions, the controller 150a may select and apply adjustment gains 160 based upon a limiter flag 134 indicating when the limiter 130 limits the combined input signal 122. The controller 150a may be configured to select and apply various of the adjustment gains 160 in various ways according to varying needs and/or system implementations of (a) the systems that provide the audio signals to the inputs 110 and/or (b) the system overall.

Additionally, the above described systems and methods are illustrated for a single speaker channel and can easily be extended to multiple speakers. A limiter threshold can be defined for each speaker channel, and gain adjustments may be applied per loudspeaker channel. In some examples, it may be desirable to have a single gain adjustment among all loudspeaker channels because, for instance, certain applications (such as noise cancelation and/or arraying loudspeakers) may rely upon acoustic signals from various loudspeakers combining properly at a listener's ears. In such cases, a gain adjustment at one loudspeaker independent of another loudspeaker may deteriorate the proper combination of acoustic signals. Accordingly, a multi-loudspeaker system may tie all the systems 100 together and apply a constant gain, which may be the most attenuating gain selected by any of the systems 100, to maintain balance between the loudspeaker channels.

Functions, methods, and/or components of the methods and systems disclosed herein according to various aspects and examples may be implemented or carried out in a digital signal processor (DSP) and/or other circuitry, analog or digital, suitable for performing signal processing and other functions in accord with the aspects and examples disclosed herein. Additionally or alternatively, a microprocessor, a logic controller, logic circuits, field programmable gate array(s) (FPGA), application-specific integrated circuit(s) (ASIC), general computing processor(s), microcontroller(s), and the like, or any combination of these, may be suitable, and may include analog or digital circuit components and/or other components with respect to any particular implementation.

Functions and components disclosed herein may operate in the digital domain, the analog domain, or a combination of the two, and certain examples include analog-to-digital converter(s) (ADC) and/or digital-to-analog converter(s) (DAC) where appropriate, despite the lack of illustration of ADC's or DAC's in the various figures. Further, functions and components disclosed herein may operate in a time domain, a frequency domain, or a combination of the two, and certain examples include various forms of Fourier or similar analysis, synthesis, and/or transforms to accommodate processing in the various domains.

Any suitable hardware and/or software, including firmware and the like, may be configured to carry out or implement components of the aspects and examples disclosed herein, and various implementations of aspects and examples may include components and/or functionality in addition to those disclosed. Various implementations may include stored instructions for a digital signal processor and/or other circuitry to enable the circuitry, at least in part, to perform the functions described herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of managing audio headroom, the method comprising:
   receiving a first input signal;
   receiving a second input signal;
   combining the first and second input signals to provide a combined signal;
   comparing the combined signal to a threshold value;
   providing the combined signal as an output signal if the combined signal is less than the threshold value;
   providing an adjusted signal as the output signal if the combined signal is greater than the threshold value, the adjusted signal based on the combined signal;
   adjusting a gain applied to the first input signal based upon the combined signal being greater than the threshold value; and
   freezing adaptation of an adaptive filter when the gain applied is below a gain threshold.

2. The method of claim 1 further comprising counting a number of instances that the combined signal is above the threshold value and adjusting the gain applied based upon the number of instances.

3. The method of claim 1 further comprising determining a rate of instances that the combined signal is above the threshold value and adjusting the gain applied based upon the rate of instances.

4. The method of claim 1 further comprising providing an attenuation flag when the gain applied is below a gain threshold, receiving the attenuation flag, and wherein the freezing adaptation of the adaptive filter is in response to receiving the attenuation flag.

5. The method of claim 4 wherein the first input signal is an anti-noise signal provided by a noise cancelation system and the adaptive filter is a component of the noise cancelation system.

6. The method of claim 1 further comprising providing a limiting flag when the combined signal is greater than the threshold value.

7. A dynamic headroom management system comprising:
   two or more inputs to receive input signals;
   a combiner coupled to the two or more inputs that receives the input signals, combines the input signals, and provides a combined signal;
   a limiter coupled to the combiner that receives the combined signal, compares the combined signal to a threshold, provides an indicator when the combined signal exceeds the threshold, and provides an output signal based upon the combined signal; and
   a controller coupled to the limiter that receives the indicator and applies a gain to at least one of the input signals based upon the indicator and freezes adaptation of an adaptive filter when the gain applied is below a gain threshold.

8. The system of claim 7 wherein the controller counts a number of instances that the combined signal is above the threshold value, based upon the indicator, and adjusts the gain applied based upon the number of instances.

9. The system of claim 7 wherein the controller determines a rate of instances that the combined signal is above the threshold value and adjusts the gain applied based upon the rate of instances.

10. The system of claim 7 further comprising an adaptive system and wherein the controller provides an attenuation flag to the adaptive system when the gain applied is below a gain threshold to cause the adaptive system to freeze the adaptation of the adaptive filter in response to receiving the attenuation flag.

11. The system of claim 10 wherein the adaptive system is a noise cancelation system and the first input signal is an anti-noise signal provided by the noise cancelation system.

12. A non-transitory processor readable storage medium having instructions encoded thereon that when executed by a processor cause the processor to perform a method comprising:
   receiving a first input signal;
   receiving a second input signal;

combining the first and second input signals to provide a combined signal;

comparing the combined signal to a threshold value;

providing the combined signal as an output signal if the combined signal is less than the threshold value;

providing an adjusted signal as the output signal if the combined signal is greater than the threshold value, the adjusted signal based on the combined signal;

adjusting a gain applied to the first input signal based upon the combined signal being greater than the threshold value; and freezing adaptation of an adaptive filter when the gain applied is below a gain threshold.

13. The storage medium of claim 12 having instructions encoded thereon that further cause the processor to count a number of instances that the combined signal is above the threshold value and adjusting the gain applied based upon the number of instances.

14. The storage medium of claim 12 having instructions encoded thereon that further cause the processor to determine a rate of instances that the combined signal is above the threshold value and adjusting the gain applied based upon the rate of instances.

15. The storage medium of claim 12 having instructions encoded thereon that further cause the processor to provide an attenuation flag to an adaptive system when the gain applied is below a gain threshold, to cause the adaptive system to freeze the adaptation of the adaptive filter in response to the attenuation flag.

16. The storage medium of claim 15 wherein the first input signal is an anti-noise signal provided by a noise cancelation system and the adaptive filter is a component of the noise cancelation system.

17. The storage medium of claim 12 having instructions encoded thereon that further cause the processor to provide a limiting flag when the combined signal is greater than the threshold value.

* * * * *